United States Patent
Williams et al.

(10) Patent No.: US 6,583,065 B1
(45) Date of Patent: Jun. 24, 2003

(54) SIDEWALL POLYMER FORMING GAS ADDITIVES FOR ETCHING PROCESSES

(75) Inventors: Raney Williams, Portland, OR (US); Jeffrey Chinn, Foster City, CA (US); Jitske Trevor, Sunnyvale, CA (US); Thorsten B. Lill, Sunnyvale, CA (US); Padmapani Nallan, Sunnyvale, CA (US); Tamas Varga, Sunnyvale, CA (US); Herve Mace, Aix-en-Provence (FR)

(73) Assignee: Applied Materials Inc., Santa Clara, CA (US)

( * ) Notice: Subject to any disclaimer, the term of this patent is extended or adjusted under 35 U.S.C. 154(b) by 0 days.

(21) Appl. No.: 09/366,509

(22) Filed: Aug. 3, 1999

(51) Int. Cl.$^7$ .............................................. H01L 21/302
(52) U.S. Cl. ...................... 438/714; 438/719; 438/721; 438/723; 438/724; 438/711; 216/67; 216/79; 216/80
(58) Field of Search ................................. 438/719, 721, 438/723, 724, 714, 711; 216/67, 79, 80

(56) References Cited

U.S. PATENT DOCUMENTS

| | | | |
|---|---|---|---|
| 4,211,601 A | * 7/1980 | Mogab | 156/643 |
| 4,687,543 A | * 8/1987 | Bowker | 156/643 |
| 5,112,435 A | 5/1992 | Wang et al. | |
| 5,147,500 A | * 9/1992 | Tachi et al. | 156/643 |
| 5,286,344 A | * 2/1994 | Blalock et al. | 156/657 |
| 5,310,454 A | * 5/1994 | Ohiwa et al. | 156/643 |
| 5,338,399 A | * 8/1994 | Yanagida | 156/662 |
| 5,366,590 A | * 11/1994 | Kadomura | 156/662 |
| 5,376,228 A | * 12/1994 | Yanagida | 156/651 |
| 5,423,945 A | * 6/1995 | Marks et al. | 156/662.1 |
| 5,429,710 A | * 7/1995 | Akiba et al. | 216/17 |
| 5,445,712 A | * 8/1995 | Yanagida | 156/662 |
| 5,520,770 A | 5/1996 | Namose | |
| 5,525,552 A | 6/1996 | Huang | 437/41 |
| 5,681,780 A | * 10/1997 | Mihara et al. | 437/228 |
| 5,807,789 A | 9/1998 | Chen et al. | 438/714 |
| 5,814,563 A | * 9/1998 | Ding et al. | 438/714 |
| 5,830,807 A | 11/1998 | Matsunga et al. | |

(List continued on next page.)

FOREIGN PATENT DOCUMENTS

| | | |
|---|---|---|
| JP | 04-298035 | * 10/1992 |
| JP | 6283477 | 10/1994 |
| JP | 07-022391 | * 1/1995 |
| JP | 11162941 | 6/1996 |
| JP | 11-162941 | 6/1999 |
| WO | WO9925015 | 5/1999 |

OTHER PUBLICATIONS

"Pattern Profile Control In Magnetron Reactine Ion Etching Of Poly–S;"; J. Vac. Sci & Tech B; vol. 10; No. 5; 9–92'; pp. 2192–2196; Kimizuka et al.*

U.S. patent application entitled, "Self–Cleaning Etch Process"; filed Nov. 12, 1997; Ser. No. 08/969,122; Inventors: Qian, et al.

U.S. patent application entitled, "Process for Etching Silicon–Containing Layers on Semiconductor Substrates"; filed Jul. 16, 1998; Ser. No. 09/116,621; Inventors: Nallan, et al.

Maa, et al, "Effects on sidewall profile of Si etched in $BCl_3/Cl_2$ chemistry", J. Vac. Sci. Technol.B 8(4), Jul./Aug. 1990.

PCT International Search Report, International Application No. PCT/US 00/21456, dated Aug. 3, 2000.

*Primary Examiner*—George Goudreau
(74) *Attorney, Agent, or Firm*—Ashok E. Janah; Joseph Bach (57) ABSTRACT

A process of reducing critical dimension (CD) microloading in dense and isolated regions of etched features of silicon–containing material on a substrate uses a plasma of an etchant gas and an additive gas. In one version, the etchant gas comprises halogen species absent fluorine, and the additive gas comprises fluorine species and carbon species, or hydrogen species and carbon species.

13 Claims, 7 Drawing Sheets

U.S. PATENT DOCUMENTS

| | | | |
|---|---|---|---|
| 5,861,233 A | * 1/1999 | Sekine et al. | 430/296 |
| 5,872,061 A | * 2/1999 | Lee et al. | 438/705 |
| 5,874,362 A | * 2/1999 | Wong et al. | 438/719 |
| 5,880,037 A | * 3/1999 | Arleo | 438/740 |
| 5,900,163 A | 5/1999 | Yi et al. | |
| 5,994,229 A | * 11/1999 | Chen et al. | 438/700 |
| 6,020,246 A | * 2/2000 | Koscielniak et al. | 438/341 |
| 6,037,266 A | * 3/2000 | Tao et al. | 438/719 |

* cited by examiner

SIDEWALL POLYMER FORMING GAS ADDITIVES FOR ETCHING PROCESSES

BACKGROUND

The present invention relates to a process of etching semiconductor substrates.

In the manufacture of integrated circuits, silicon-containing layers on a substrate are etched to form gates, vias, contact holes, trenches, and/or interconnect lines. The etched areas are later filled with electrically conductive material to form electrically conductive interconnects or with insulating materials in the case of gate structures. Examples of such silicon-containing materials include silicon dioxide, silicon nitride, polysilicon, metal silicide, and monocrystalline silicon. The substrate may also contain layers of other materials, for example metal conductor layers, insulative layers, anti-reflective layers, or diffusion layers, among others.

Figure 1A:
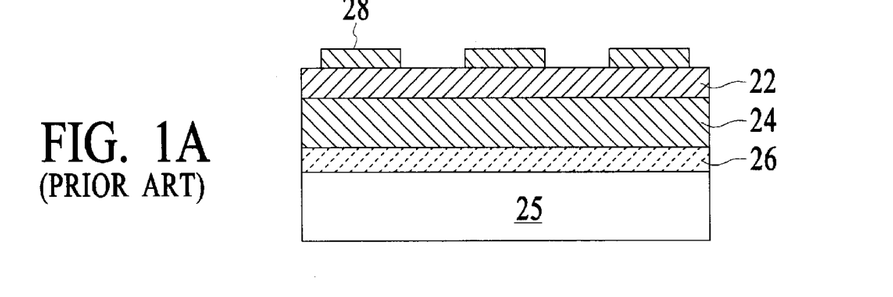
FIGS. 1a and 1b (prior art) are schematic cross-sections of a multi-layer substrate of the prior art, before and after etching, respectively, and illustrating silicon-based sidewall passivation layers formed by prior art etching processes.
Figure 1B:
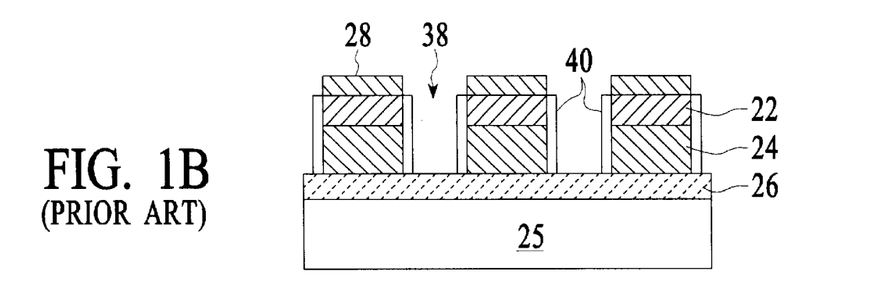
Figure 1C:
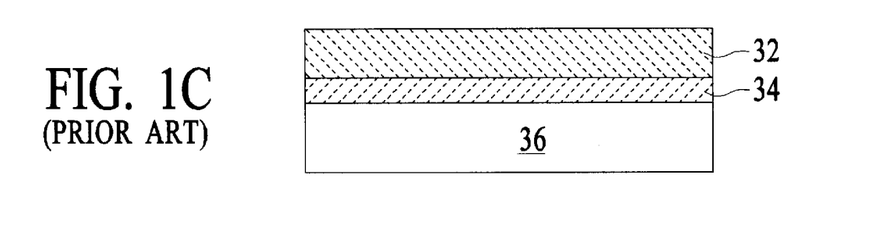
FIGS. 1c and 1d (prior art) are schematic cross-sections of a substrate having an overlying mask layer of the prior art, before and after etching, respectively, and illustrating silicon-based sidewall passivation layers formed by prior art etching processes.
Figure 1D:
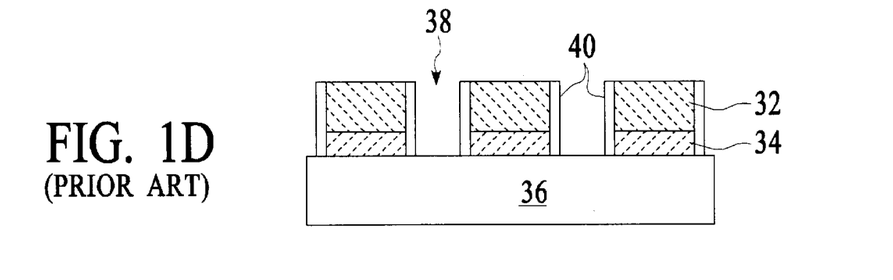

In a typical etching process, a patterned mask composed of a material less susceptive to etching, such as photoresist, or a hard mask layer such as silicon dioxide or silicon nitride, is formed over the substrate. Thereafter, the substrate is placed within a process chamber and etched by a plasma of etchant gas in the chamber. The residue of material deposited on the substrate is then etched. The composition of the residue is dependent upon the etchant gas that is used, the substrate material, and composition of the mask or resist layer. The etching process is illustrated schematically in FIGS. 1a through 1d. These figures are shown merely as examples of substrates and are not intended to limit the scope of the invention. In a typical configuration, as shown in FIG. 1a, the substrate 25 comprises a metal silicide layer 22 formed over a doped or undoped polysilicon layer 24 which is formed over a dielectric layer 26, such as a silicon dioxide layer. Patterned resist features 28 are formed over the substrate to define areas to be etched. FIG. 1b shows the same substrate after etching. In another example, FIG. 1c shows a silicon substrate 36 having a mask layer 32 formed over a thin silicon dioxide layer 34. FIG. 1d shows the same substrate after etching. The layers of the substrate may include but are not limited to the following: metal silicide, silicon, polysilicon, silicon nitride, or silicon dioxide layers; diffusion barrier and/or adhesion promoting layers of Ti, TiN, Ta, TaN, W, WN; metal layers comprising aluminum, copper, tungsten, and alloys thereof; antireflection layers of TiN, silicon oxynitride or organic anti-reflective material; dielectric layers of silicon dioxide, silicate glass, PSG, BPSG, $Si_3N_4$, and TEOS deposited glass; or the substrate itself.

One problem in etching such substrates is the occurrence of critical dimension microloading. The critical dimensions (CD) are the predefined dimensions of the etched features which affect the electrical properties of the features. For example, the electrical resistance of a metal interconnect line is proportional to its cross-sectional area which is a function of its height and width. As the dimensions of etched features become smaller due to advances in etching technology, the cross-sectional area of the interconnected lines is a critical dimension that should be maintained as close as possible to the desired dimensions to provide the required electrical resistance levels. Especially for electrically conducting features, tapering cross-sections, cross-sectional profiles that vary as a function of the spacing between the features, or other variations in the profile of the features are not desirable. Critical dimension (CD) measurements are typically made using top-down scanning electron micrographs of the substrate before and after etching or by suitable electrical measurements. Critical dimension microloading is a measure of the variation in critical dimensions between dense and isolated regions of the substrate. The dense regions have a high density of etched features and the isolated regions have a low density of etched features. It is important and desirable to reduce CD microloading effects across the substrate to maintain uniform critical dimensions for all the etched features.

When a silicon-containing layer on a substrate is etched by conventional methods, etched or sputtered silicon species combine with gaseous species to form a sidewall passivation layer 40 on the sidewalls of the etched features. When the silicon species combine with oxygen, a sidewall passivation layer 40 comprising silicon dioxide is formed, and this passivation layer 40 controls the rate of etching of the silicon-containing layer. However, conventional processes often result in tapering of the profile of the etched features, and may also result in CD microloading of etched features that are in dense and isolated regions on the substrate. This occurs because in the isolated regions of the etched features (where there are few etched features per unit area) there tends to be thicker sidewall passivation layers deposited on the etched features than in the dense regions (where there are more etched features per unit area).

Figure 2A:
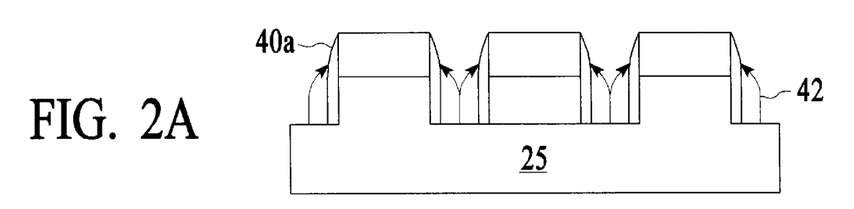
FIGS. 2a and 2b are schematic cross-sectional representations of the deposition of silicon-based sidewall passivation on dense and isolated regions of etched features, respectively, using prior art etching methods.
Figure 2B:
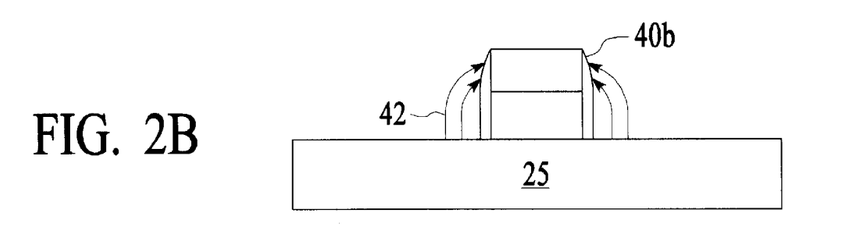

In current etching techniques, for example those using an etchant gas comprising HBr; $Cl_2$, and He—$O_2$, profile tapering and CD microloading occurs primarily due to backsputtering of the etched silicon, as shown in FIGS. 2a and 2b. FIG. 2a represents a dense feature portion of a silicon-containing substrate 25 and FIG. 2b represents a portion of the substrate 25 where the etched features are relatively isolated. As the substrate 25 is etched, backsputtering of silicon occurs due to the energetic bombardment of the plasma species on the substrate. The backsputtered silicon (as represented by the arrows 42) combines with the $O_2$ to form $SiO_2$ that is deposited on the sidewalls of the etched feature as the silicon dioxide containing passivation layers 40a and 40b. Comparing FIGS. 2a and 2b, the passivation layers 40a on the etched features at the dense regions is not as thick as the passivation layers 40b formed on the etched features in the isolated regions due primarily to the localized geometry of the etching features and the resulting relatively lower area of exposed silicon-containing material. These varying thicknesses lead to excessive profile tapering and CD microloading across the substrate.

Figure 3:
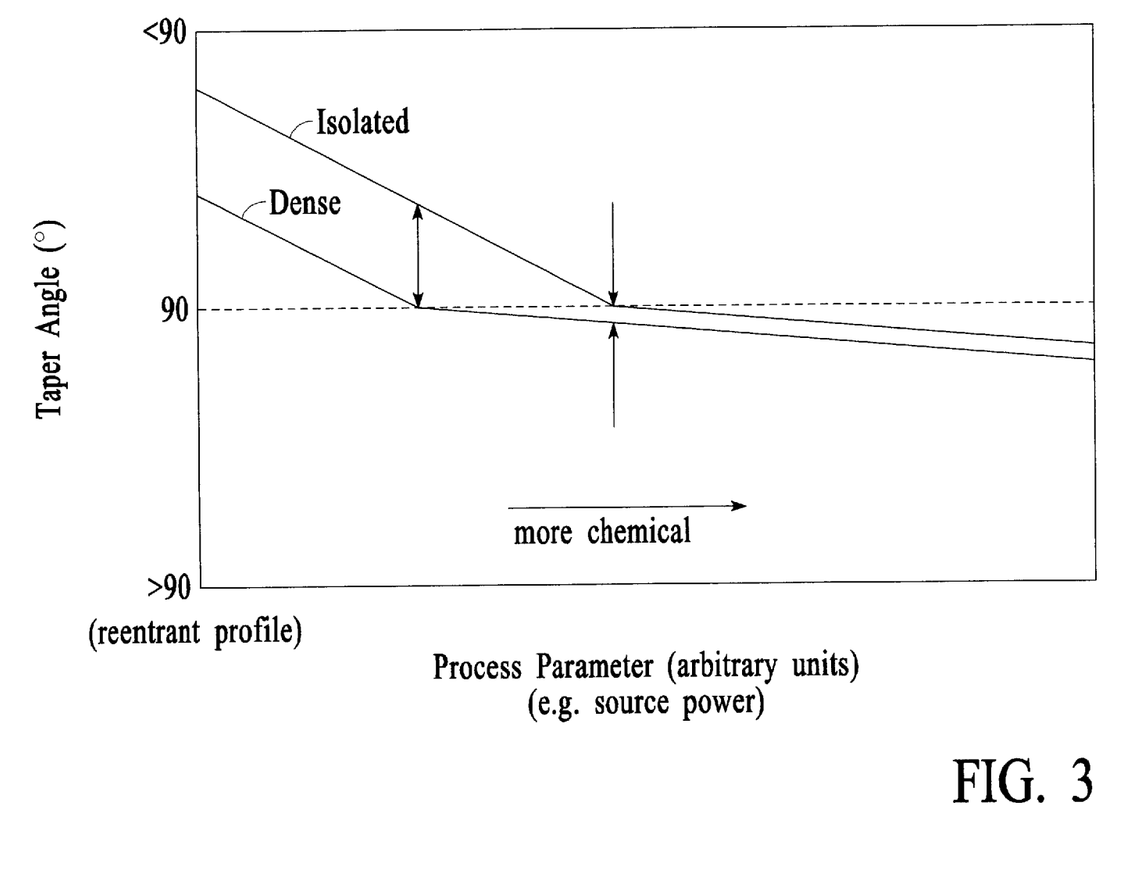
FIG. 3 is a plot showing the CD bias and CD microloading dependence of dense and isolated regions on the substrate as a function of a process parameter.

FIG. 3 is an etch simulation model showing the difficulty in minimizing tapering of the profile of the etched feature while also reducing CD microloading at the dense and isolated regions on the substrate. It is seen that tapering can be reduced to zero (i.e., a profile angle of 90 degrees) and CD microloading can also be reduced in the dense and isolated regions of the substrate, by utilizing a more isotropic or "chemical" etching process. In isotropic etching processes, the etching rate through the sidewall of the etched feature is higher than in conventional anisotropic or less chemical etching processes. The isotropic etching process reduces the thickness of the thicker sidewall passivation layers that are formed on the etched features in some of the regions of the substrate by reacting with and partially removing these layers. However, the problem with using such chemical or isotropic etching is that the etched features have narrower or skinner profiles because etching proceeds along the sidewall at higher rates. Thus it is difficult to balance low degrees of tapering and CD microloading effects, with the high degree of anisotropic etching that is desired on the substrate.

Therefore there is a need for an etching process that provides substantially anisotropic etching, with reduced tapering of etched features, and low critical dimension microloading across the substrate. There is a further need for an apparatus capable of providing such etching characteristics.

SUMMARY

The aforementioned problems have been overcome by the present invention. In one aspect, the present invention comprises a method of etching silicon-containing material on a substrate, comprising the steps of placing the substrate with the silicon containing material in a chamber, and forming a plasma from a process gas which is introduced into the chamber, the process gas comprising an etchant gas comprising halogen species absent fluorine, and an additive gas comprising fluorine species and carbon species.

In another aspect, a method of etching silicon-containing material on a substrate comprises the steps of placing the substrate with the silicon-containing material in a chamber and forming a plasma from process gas comprising one or more HBr and HCl, one or more of $Cl_2$ and HI, and a fluorocarbon gas.

In yet another aspect, a method of etching a substrate comprising silicon-containing material comprises the steps of placing a substrate with the silicon-containing material in a chamber and forming a plasma from process gas comprising HBr, $Cl_2$, and $CF_4$.

In another aspect, a method of etching silicon-containing material on a substrate comprises the steps of placing the substrate with the silicon containing material in a chamber and forming a plasma from a process gas comprising an etchant gas comprising halogen species absent fluorine and additive gas comprising carbon species and hydrogen species.

In a further aspect, a method of etching silicon-containing material on a substrate comprises the steps of placing the substrate with the silicon-containing material in a chamber and forming a plasma from process gas comprising one or more HBr and HCl, one or more of $Cl_2$ and HI, and $CH_4$.

In yet another aspect, an apparatus for etching a substrate comprising silicon-containing material, the apparatus comprising a support adapted to support the substrate; a controller adapted to regulate gas flow control valves to introduce a process gas into the chamber, the process gas comprising an etchant gas comprising halogen species absent fluorine, and an additive gas comprising fluorine species and carbon species; a plasma generator to energize the process gas to form a plasma to process the substrate; and an exhaust to exhaust the process gas.

DRAWINGS

These and other features, aspects and advantages of the present invention will be better understood from the following drawings, detailed description and appended claims, which illustrate examples of the invention. While the description and drawings illustrate exemplary features of the invention, it will be understood that each of the features can be used in the invention in general, not merely in the context of the particular drawings, and the invention includes any combination of these features.

DESCRIPTION

Figure 4:
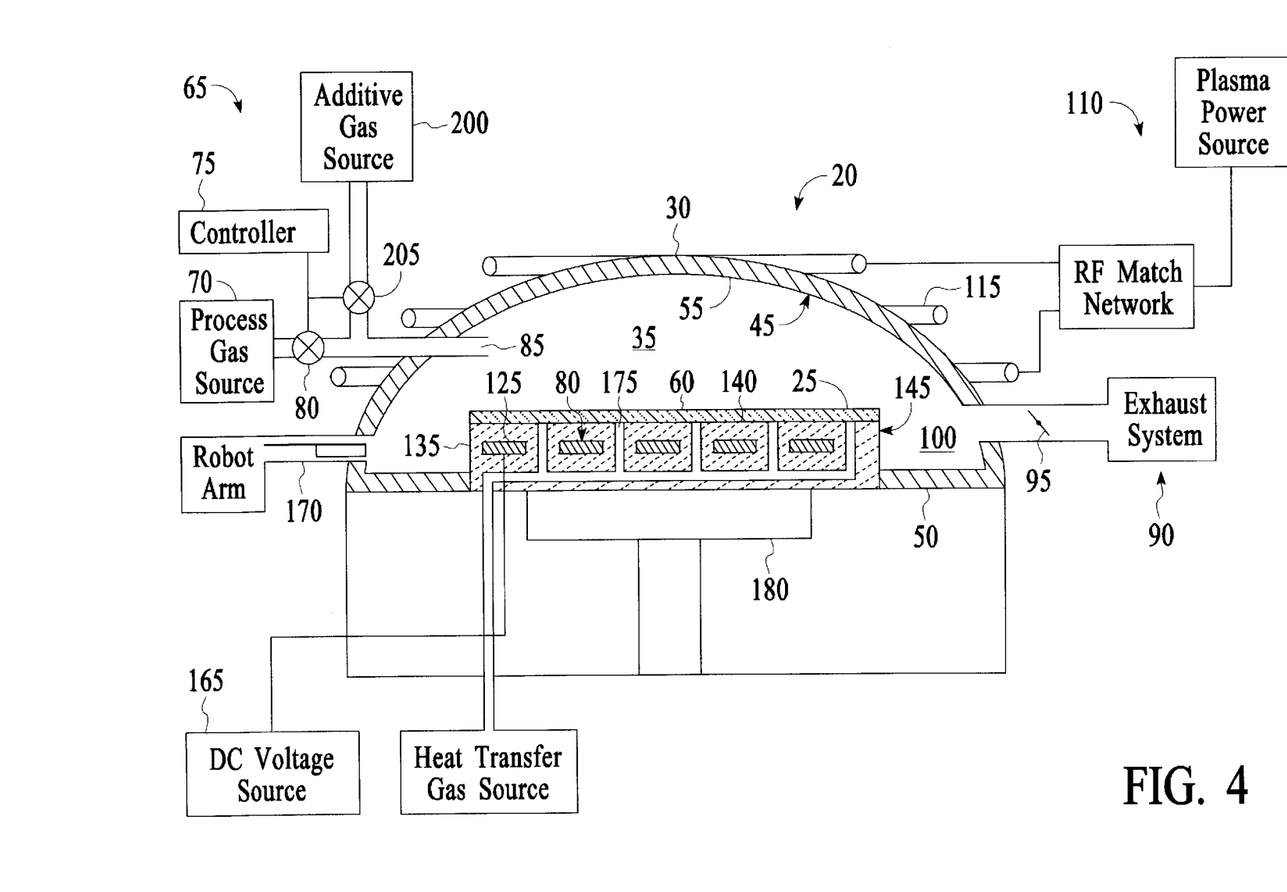
FIG. 4 is a sectional schematic side view of an exemplary etching apparatus of the present invention.

An apparatus 20 suitable for etching a substrate 25 according to the present invention, as schematically illustrated in FIG. 4, comprises an enclosed process chamber 30 defining a process zone 35 for processing the substrate 25. A load-lock transfer area (not shown) is maintained at low pressure for holding a cassette of substrates 25. The particular embodiment of the apparatus 20 shown herein is suitable for processing of semiconductor substrates 25, is provided only to illustrate the invention, and should not be used to limit the scope of the invention. The enclosed chamber 30 has sidewalls 45 and a bottom wall 50 fabricated from any one of a variety of materials including metals, ceramics, glasses, polymers, and composite materials. The process zone defined in the etching chamber 30 is around the substrate 25, comprises a volume of at least about 10,000 cm$^3$, and is below a ceiling 55 that is flat or rectangular shaped, arcuate, conical, dome-shaped, or multiradius dome shaped.

Process gas is introduced into the chamber 30 through a gas distribution system 65 that includes a process gas source 70 and a gas flow control system that comprises a controller 75, such as a conventional computer system or other electronic hardware, that may be used to regulate a gas flow control valve 80. The gas distribution system 65 can comprise gas outlets 85 located peripherally around the substrate 25 (as shown) or a showerhead mounted on the ceiling of the chamber 30 with outlets therein (not shown). An additive gas source 200 provides additive gas to the chamber 30 via an electronically operated valve 205. Spent process gas and etchant byproducts are exhausted from the process chamber 30 through an exhaust system 90 (typically including a 1000 liter/sec roughing pump) capable of achieving a minimum pressure of about $10^{-3}$ mTorr in the chamber 30. A throttle valve 95 is provided in the exhaust 90 to control the flow of spent process gas and the pressure of process gas in the chamber 30. A pumping channel 100 is used to pump gases out of the chamber 30.

A plasma is generated from the process gas introduced into the chamber 30, using a plasma generator 110 that couples an electric field into the process zone of the chamber. A suitable plasma generator 110 comprises an inductor antenna 115 consisting of one or more inductor coils having a circular symmetry with a central axis coincident with the longitudinal vertical axis that extends through the center of the process chamber 30 and perpendicular to the plane of the substrate 25. Preferably, the inductor antenna 115 comprises solenoid coils having from 1 to 10 turns, and more typically from 2 to 6 turns. The arrangement and number of solenoid coils are selected to provide the desired product of current and antenna turns (d/dt)(N•I) near the ceiling 55 to provide a strong inductive flux linkage with close coupling to the plasma and therefore greater plasma ion density in the plasma zone adjacent to the substrate 25, as described in U.S. Pat. No. 6,165,311 which is incorporated herein by reference. When the inductor antenna 115 is positioned near the dome ceiling 55, the ceiling of the chamber 30 comprises dielectric material which is transparent to RF fields, such as a silicon dioxide or silicon. Preferably, the inductor coil 115 wrapped around the sidewall 45 of the process chamber 30 is a multiradius inductor coil having a "flattened" dome shape that provides increased plasma ion density directly over the substrate center 60 because ion density is affected by local ionization near the inductor coil 115, and a multiradius inductor coil is closer to the substrate center 60 than a hemispherical coil.

The plasma formed in the plasma zone may also be enhanced using magnetically enhanced reactors (not shown) in which a magnetic field generator such as a permanent magnet or electromagnetic coils, are used to apply a magnetic field in the plasma zone to increase the density and uniformity of the plasma. Preferably, the magnetic field comprises a rotating magnetic field with the axis of the field rotating parallel to the plane of the substrate, as described in U.S. Pat. No. 4,842,683, issued Jun. 27, 1989, which is incorporated herein by reference. The magnetic field in the chamber should be sufficiently strong to increase the density of the ions formed in the plasma, and sufficiently uniform to reduce charge-up damage to features such as CMOS gates. Generally, the magnetic field as measured on the surface of the substrate is less than about 500 Gauss, more typically from about 10 to about 100 Gauss, and most typically from about 10 Gauss to about 30 Gauss.

As an alternative, or in addition to the inductor antenna 115, one or more process electrodes (not shown) may be used to accelerate or energize the plasma ions in the chamber 30. The process electrodes typically include a first electrode that forms a wall of the process chamber and a second electrode below the substrate. The two electrodes are maintained at different electrical potentials relative to one another to form an energized field that capacitively couples energy to the process gas to form a plasma, and also serves to accelerate plasma ions toward the substrate 25.

The enclosed chamber 30 comprises one or more ceramic surfaces that serve different functions. For example, in one embodiment, the walls 45, 50, 55 of the process chamber are coated with a ceramic material, such as boron carbide, boron nitride, silicon, silicon oxide, silicon carbide, or silicon nitride, to protect the walls from chemically erosion in particular etchant gas compositions. As an example, the ceiling of the chamber may comprise aluminum oxide. When the chamber contains such ceramic surfaces, etch residues that react with the ceramic surfaces may be difficult to remove. For example, aluminum oxide or nitride surfaces when exposed to oxygen or moisture form $Al-OH^-$ surface-functional groups that chemically react with the etch residue to form a hard adherent coating on the chamber surfaces or components.

Another ceramic surface useful in the process chamber 30 is that of a monolith ceramic 135 having a ceramic surface 140 for receiving a substrate 25, and an electrode 125 below the ceramic surface 140, to serve as an electrostatic chuck 145. Suitable ceramic materials include one or more of aluminum oxide, aluminum nitride, boron carbide, boron nitride, silicon, silicon oxide, silicon carbide, silicon nitride, and titanium oxide. The electrode 125 is fabricated from an electrical conductor metal such as tungsten, tantalum or molybdenum. The electrostatic chuck 145 generates an electrostatic charge that electrostatically holds the substrate 25 to the receiving surface 140 of the ceramic member 135 when a DC chucking voltage from a voltage source 165 is applied to the electrode 125 via an electrical conductor 150.

Etching & Cleaning Process

Operation of the etching chamber 30 to etch one or more of the layers on the substrate 25, and simultaneously clean the etching chamber, will now be described. The substrate 25 typically comprises a semiconductor material, such as a silicon or gallium arsenide wafer, with a plurality of layers comprising, for example, an underlayer of silicon dioxide that functions as a gate oxide layer for MOS transistors, and an overlayer of polycide, which is a combination of tungsten silicide and underlying polysilicon layers. The metal silicide layer on the substrate 25 comprises, for example, tungsten, tantalum, titanium, or molybdenum silicide. A polysilicon layer is below the metal silicide layer and over a silicon dioxide layer. A patterned mask layer, such as photoresist, or silicon dioxide or silicon nitride hard mask, is formed on the substrate 25. The exposed portions of the substrate 25 between the mask layer are etched to form features, such as for example, contact holes for fabricating gate electrodes for MOS transistors; polycide interconnecting features that are typically used as gate electrodes; and vias which are multilayer metal structures used to electrically connect two or more electrically conductive layers separated by insulating silicon oxide/nitride layers. In another example, the substrate comprises silicon nitride layers or silicon oxide layers on a silicon (doped or undoped) substrate.

To perform the process of the present invention, a substrate 25 is transferred using a robot arm 170 from a load-lock transfer chamber through a slit valve and into the chamber 30. A lift finger assembly (not shown) has lift fingers that extend through lift finger openings in the chuck 145 to receive or lift the substrate 25 off the chuck 145. The robot arm 170 places the substrate 25 on the tips of the lift fingers (not shown) that are elevated by the pneumatic lift mechanism 180 to extend about 2 to 5 centimeters above the surface of the chuck 145. The pneumatic mechanism, under the control of a computer system, lowers the substrate 25 onto the electrostatic chuck 145, and helium is supplied through apertures 175 in the chuck to control the temperature of the substrate 25.

A process gas comprising etchant gas for etching the substrate is introduced into the chamber 30 through the gas outlet 85 and the gas in the chamber is typically maintained at a pressure ranging from about 0.1 to about 400 mTorr. Suitable etchant gases for etching layers on the substrate 25, include for example, HCl, $BCl_3$, HBr, $Br_2$, $Cl_2$, HI, $CCl_4$, $SiCl_4$, $SF_6$, F, $NF_3$, HF, $CF_3$, $CF_4$, $CH_3F$, $CHF_3$, $C_2H_2F_2$, $C_2H_4F_6$, $C_2F_6$, $C_3F_8$, $C_4F_8$, $C_2HF_5$, $C_4F_{10}$, $CF_2Cl_2$, $CFCl_3$, $O_2$, $N_2$, He, and mixtures thereof. The etchant gas is selected to provide high etch rates, and highly selective etching of the particular layers that are being etched. When multiple layers are sequential etched, first, second, third, etc., etchant gas compositions are sequentially introduced into the chamber to etch each particular layer. Referring to FIG. 2, a plasma is energized from the etchant gas using the plasma generator 110 by inductively and/or capacitively coupling energy into the chamber 30.

For etching of silicon-containing material, preferably, the etchant gas comprises halogen species, such as chlorine, bromine or iodine species in elemental form or in the form of a compound, but is absent, i.e., does not contain fluorine species. For example, preferably the etchant gas comprises one or more of HBr, HCl, $Cl_2$, HI, $O_2$, and He—$O_2$. Such etchant gas preferentially etches silicon-containing material, such as for example, silicon, polysilicon, silicon dioxide and silicon nitride. More preferably, the etchant gas comprises HBr, $Cl_2$, and optionally $O_2$ or He—$O_2$ and the HCl may be substituted for HBr and HI can be substituted for $Cl_2$.

Figure 5A:
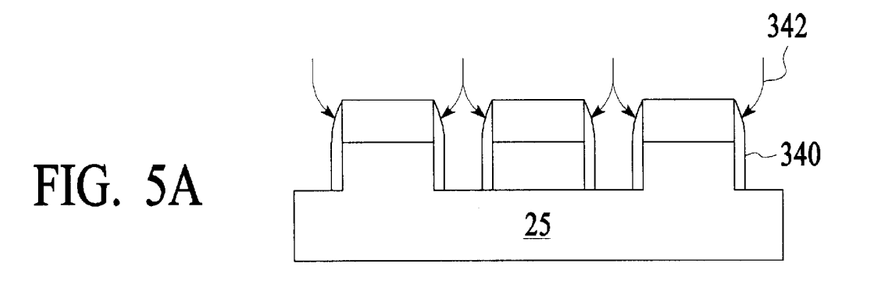
FIG. 5a is a schematic cross-sectional representation of the deposition of gas phase borne carbon-containing sidewall passivation deposits on etched features in dense regions in a process according to the present invention.
Figure 5B:
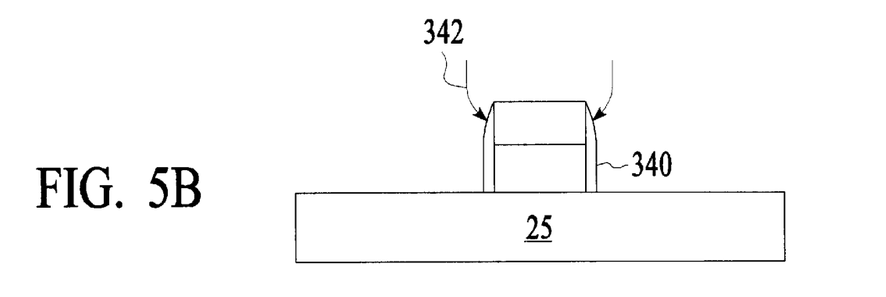
FIG. 5b is a schematic cross-sectional representation of the deposition of gas phase borne carbon-containing sidewall passivation deposits on etched features in an isolated region in a process according to the present invention.

The process gas further comprises additive gas comprising fluorine species and carbon species to form passivating deposits on the sidewalls of the etched features. By additive gas comprising fluorine and carbon species it is meant a gas containing elemental or compound forms of fluorine or carbon. It has been discovered that backsputtered deposits 42 that originate from sputtering of the silicon-containing material are reduced when the substrate is etched by adding an additive gas comprising carbon species and fluorine species to the process gas. It is believed that the additive gas dissociates or ionizes in the plasma such that the fluorine species combines with sputtered silicon species (originating from the sputtered silicon-containing material) to produce $CF_x$ and $SiF_y$ species. The $SiF_y$ species is a volatile species that is exhausted from the chamber and thus does not condense or redeposit onto the sidewalls of the substrate. The fluorine species in the additive gas suppresses backsputtering of silicon dioxide by combining with sputtered silicon to form volatile $SiF_y$. As a result, the sidewalls are not coated with a silicon dioxide containing passivation layer. However, the $CF_x$ species combines with hydrogen from the etchant gas, such as HBr, HCl, HI or the like, to produce $CHF_x$, and a film of $CHF_x$ deposits on the substrate and in the form of a carbon-based sidewall passivation layer 340, as shown in FIGS. 5a and 5b. These effects are explained as follows:

Using the traditional chemistry

Using the additive gas ($CF_4$) chemistry

It is believed that this gas-phase based passivation material obtained from the present process is insensitive to the localized geometry or density of the features in different regions of the substrate, and consequently, the sidewall passivation layer 340 is uniformly deposited on etched features in both the dense and isolated regions of the substrate. This reduces CD microloading effects across the substrate and allows more complex geometries of etched features to be formed on the substrate.

The additive gas suppresses backsputtering of silicon from the silicon-containing material on the substrate, and provides a gas phase based carbon based sidewall passivation to replace the backsputtered silicon-based sidewall passivation material. The additive gas comprises fluorocarbon gases such as $CF_4$, $CHF_3$ or other gases that contain carbon species and fluorine species. Other gaseous sources of carbon and fluorine can also be used as the additive gas. For example, $CHF_3$, $CH_2F_2$, $CH_3F$, $C_4F_8$, $C_2F_6$, or other carbon and fluorine containing gases. Alternatively, a fluorine containing gas, such as $NF_3$, $SF_6$, $Cl_2F$, $ClF_2$, or $SOF_2$, can be used in combination with a carbon-containing gas, such as $CH_4$, $C_2H_6$, $C_2H_4$, $C_2H_2$, etc., as a possible substitute for $CF_4$. These gases are merely exemplary gases and this list is not intended to be exhaustive.

It has also been discovered that by adding fluorine to the process gas the fluorine will etch away the backsputtered silicon and prevent the formation of the silicon dioxide containing layers on the sidewall of etched features. This, in turn, prevents excessive passivation of etched sidewalls with silicon dioxide containing layers. It has been further discovered that $CF_x$ will combine with hydrogen to form $CHF_x$ which serves as a carbon-based sidewall passivation material. Since the sidewall passivation material is in gas phase, rather than as a result of backsputtering, the sidewall passivation material is equally applied to all of the etched features in both the dense and isolated regions, i.e., the sidewall passivation thickness is not dependent on the local density or of the etched features. CD microloading is thereby reduced.

In another embodiment of the invention, the process gas comprises etchant gas such as HBr (or alternatively HCl or HI) and $Cl_2$, and additive gas comprising hydrogen and carbon species, such as $CH_4$ or other $C_xH_y$ gases. In this process, the halogen gases etch the silicon containing material isotropically. The $SiO_2$-based backsputtered sidewall passivation layer is not formed and hence there is no need to suppress formation of the sputtered sidewall material by adding fluorine-containing gases to the process gas. The hydrocarbon gas such as $CH_4$, or the like, gas provides a carbon-polymer based sidewall passivation by being partially dissociated in the plasma. Preferably, the hydrocarbon gas has a general formula $C_xH_y$ with a ratio of x to y of 1:4 to provide a large amount of free carbon in the gas. This additive gas also provides a gas-phase based passivation process because the hydrocarbon gas dissociates to form free carbon and hydrogen containing species in the plasma. The hydrocarbon gas species and their reaction products are deposited as a carbon based passivation layer on the freshly etched features of the silicon containing material. Because the passivation layer is primarily composed of carbon and other organic materials as opposed to inorganic inhibitor layers, such as prior art backsputtered silicon oxide based layers, the organic passivation layer can be easily removed by a subsequent oxygen plasma stripping process.

Figure 6:
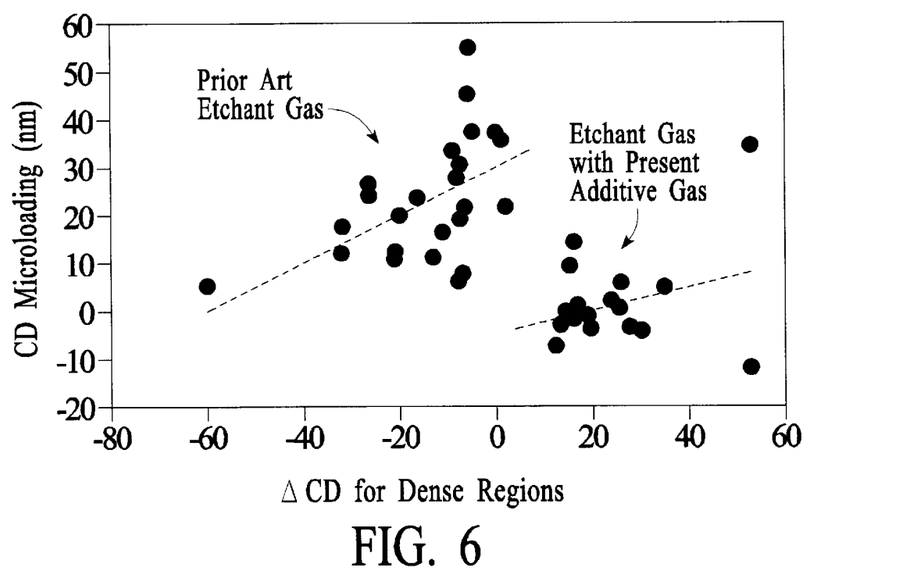
FIG. 6 is a plot showing the comparative CD microloading and ΔCD performance obtained for etching 0.25 um poly gates by traditional gas compositions and for the present gas composition.

FIG. 6 is a graph that shows comparative CD microloading and delta CD results for substrates processed by prior art methods and by the present method. It is seen that CD microloading is much higher for substrates etched in the prior art method and ranges from about 5 to about 55 nm, with an average of about 25 nm. In contrast, CD microloading for substrates etched by the present method is much less and ranged from about −10 to about 20 nm with an average of about 0. This large improvement in CD microloading over the prior art is surprising and unexpected. It is also seen that the delta CD bias is closer to zero and ranges from about 0 to about 25 (a few data points are higher), and with an average of about 15; whereas the delta CD for the prior art substrates was from about −20 to about −60, with an average of about −20. In addition, the CD microloading appeared to increase at a lower rate when $CF_4$ is added to the etchant gas than in the prior art. These data points were obtained by etching 0.25 micron gate lines in a polysilicon layer on a silicon wafer. Process parameters such as source power, bias power, gas pressure, and gas flow rates, were varied to determine changes in critical dimensions as a function of these variables.

Figure 7:
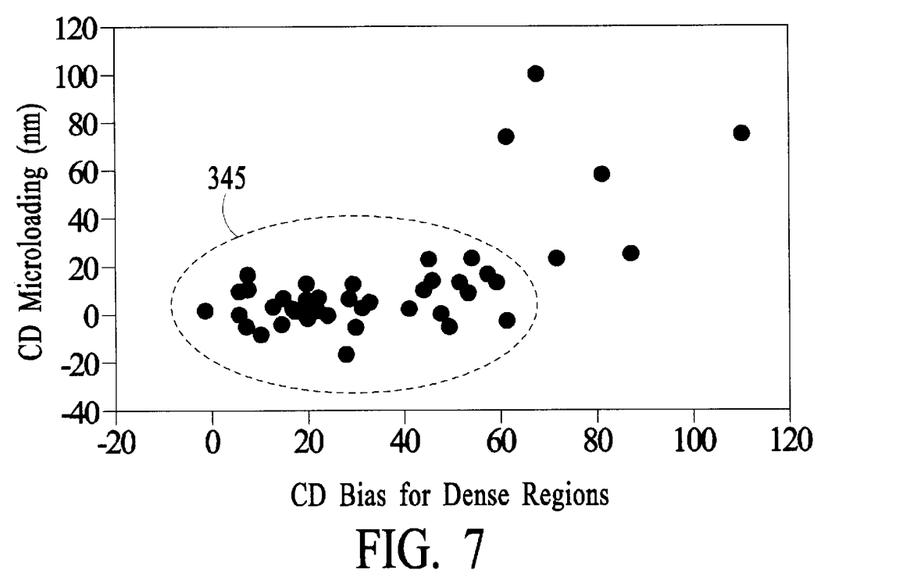
FIG. 7 is a plot showing CD microloading versus CD bias utilizing a process according to the present invention.

FIG. 7 further shows that gas phase passivation resulting from addition of $CF_4$ to the etchant gas provides low CD microloading and low CD bias values in the densely populated regions of etched features on the substrate. The closely grouped values that fall with the elliptical region 345 demonstrate good repeatability of the etching process. Again, the results represent a response of critical dimensions to variations of a process parameter matrix.

In one example of the present process, the substrate 25 having a polysilicon layer is etched by a plasma of process gas comprising HBr, $Cl_2$, $CF_4$, and optionally $O_2$ or He—$O_2$. The volumetric flow ratio and process conditions of the gaseous constituents is selected to suppress silicon back-sputtering and to cause gas-phase carbon-based sidewall passivation as discussed above. In this example, the volumetric flow ratio of $Cl_2$ to HBr is from about 5:1 to about 1:6, more preferably from about 1:2 to about 1:6, and most preferably about 1:3. The volumetric flow ratio of He—$O_2$ to $Cl_2$ is from about zero to about 1:20, more preferably from about 1:3 to about 1:13, and most preferably about 1:5. The volumetric flow ratio of $CF_4$ to (HBr+$Cl_2$+He—$O_2$) is from about 1:4 to about 1:20, more preferably from about 1:5 to about 1:10, and most preferably about 1:8. The chamber pressure can be selected to be from about 2 mTorr to about 10 mTorr, more preferably from about 4 mTorr to about 8 mTorr, and most preferably about 4 mTorr. The source power can be from about 400 W to about 3000 W, more preferably from about 400 W to about 700 W, and most preferably about 490 W. The ratio of bias power to source power can range from about 1:3 to about 1:14, more preferably from about 1:6 to about 1:10, and most preferably about 1:7.

Table 1 shows a full factorial matrix with 18 different runs utilizing different process parameters. The uniformity (rightmost column) is shown to dramatically improve when the parameters are properly selected. The Table also provides an appreciation of the variation resulting from small adjustments of process parameters.

TABLE 1

| Run No | $CF_4$ (sccm) | Source (W) | Bias (W) | Pressure (mTorr) | HBr (sccm) | $Cl_2$ (sccm) | Etch thickness | Etch rate (A:mn) | Uniformity (1 sigma) |
| --- | --- | --- | --- | --- | --- | --- | --- | --- | --- |
| 1 | 40 | 490 | 70 | 8 | 126 | 25 | 703 | 1406 | 4.3 |
| 2 | 40 | 700 | 70 | 8 | 113 | 38 | 946 | 1612 | 0.44 |
| 3 | 40 | 700 | 70 | 4 | 113 | 38 | 962 | 1644 | 0.35 |
| 4 | 40 | 700 | 70 | 4 | 126 | 25 | 916 | 1552 | 0.51 |
| 5 | 20 | 700 | 70 | 4 | 126 | 25 | 897 | 1514 | 0.29 |
| 6 | 40 | 490 | 70 | 4 | 113 | 38 | 903 | 1526 | 0.27 |
| 7 | 40 | 490 | 70 | 4 | 126 | 25 | 717.5 | 1435 | 0.84 |
| 8 | 20 | 490 | 70 | 4 | 126 | 25 | 861 | 1442 | 0.89 |
| 9 | 20 | 490 | 70 | 4 | 113 | 38 | 906 | 1532 | 0.32 |
| 10 | 40 | 490 | 70 | 4 | 126 | 25 | 858 | 1436 | 0.89 |
| 11 | 20 | 490 | 70 | 8 | 126 | 25 | 789 | 1298 | 2.13 |
| 12 | 20 | 490 | 70 | 8 | 113 | 38 | 886 | 1492 | 0.62 |
| 13 | 20 | 700 | 70 | 8 | 126 | 25 | 902 | 1524 | 0.42 |
| 14 | 40 | 700 | 70 | 8 | 126 | 25 | 906 | 1532 | 0.34 |
| 15 | 40 | 490 | 70 | 8 | 113 | 38 | 1691 | 1477 | 0.58 |
| 16 | 20 | 700 | 70 | 8 | 113 | 38 | 933 | 1586 | 0.27 |
| 17 | 30 | 595 | 70 | 6 | 120 | 31 | 908 | 1536 | 0.29 |
| 18 | 20 | 700 | 70 | 4 | 113 | 38 | 945 | 1610 | 0.45 |

Figure 8:
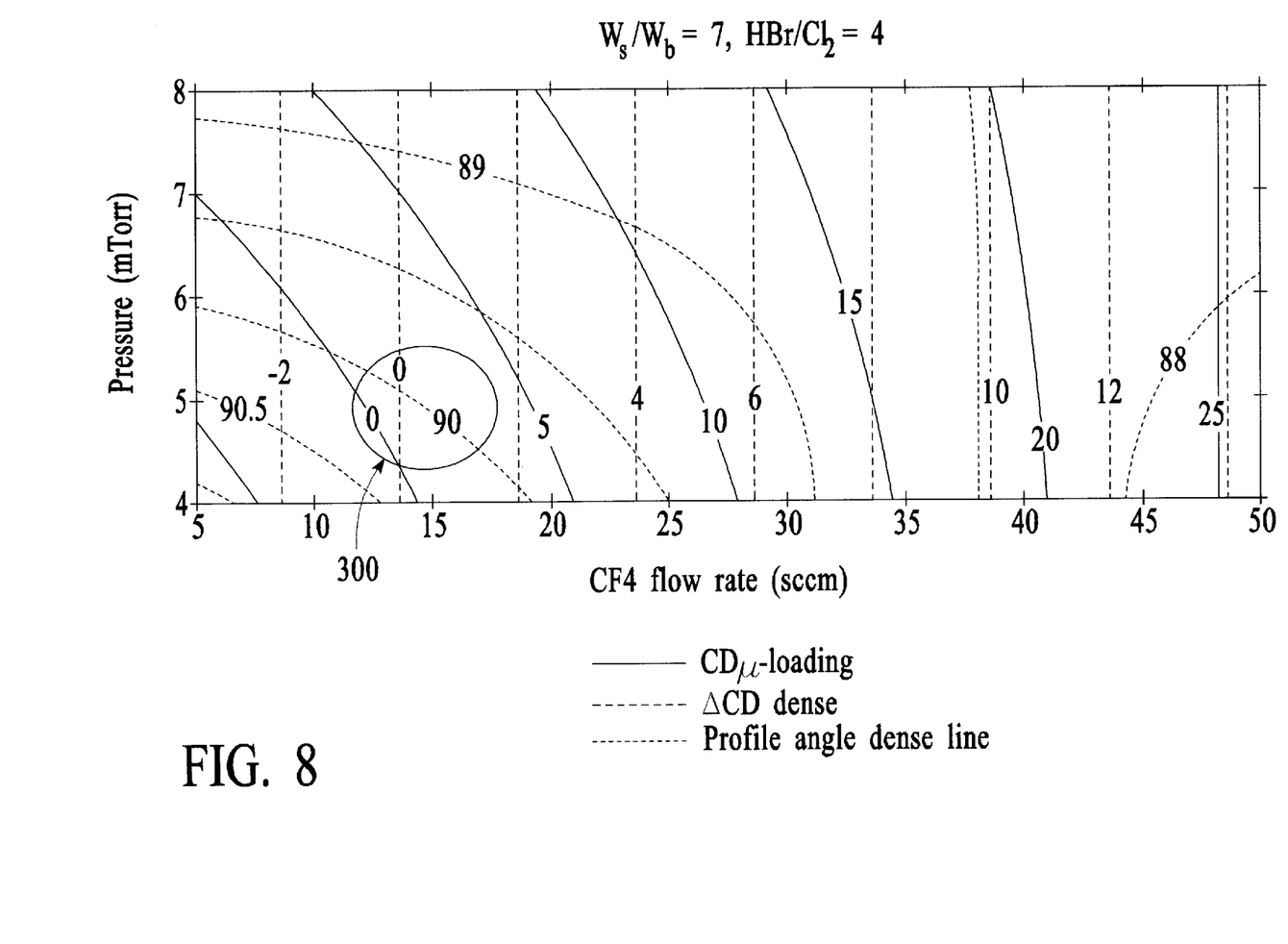
FIG. 8 is a plot of the profile angles CD microloading and ΔCD for etched features in dense and isolated regions as a function of the $CF_4$ additive gas flow rate and gas pressure in process runs using different process parameters.

FIG. 8 is a plot of measured profile angles in dense and isolated regions of the substrate, CD microloading values, and delta CD bias values obtained for varying pressure and $CF_4$ flow rates. In these examples, the ratio of source power to bias power levels was 7 and the volumetric flow ratio of HBr to $Cl_2$ was 3. While many of the results were good, the circled region 300 represented optimal results for the etched features because of a low CD bias, low CD microloading, and because profile angles of the etched features in both the dense and isolated regions were approximately 90 degrees.

Figure 9:
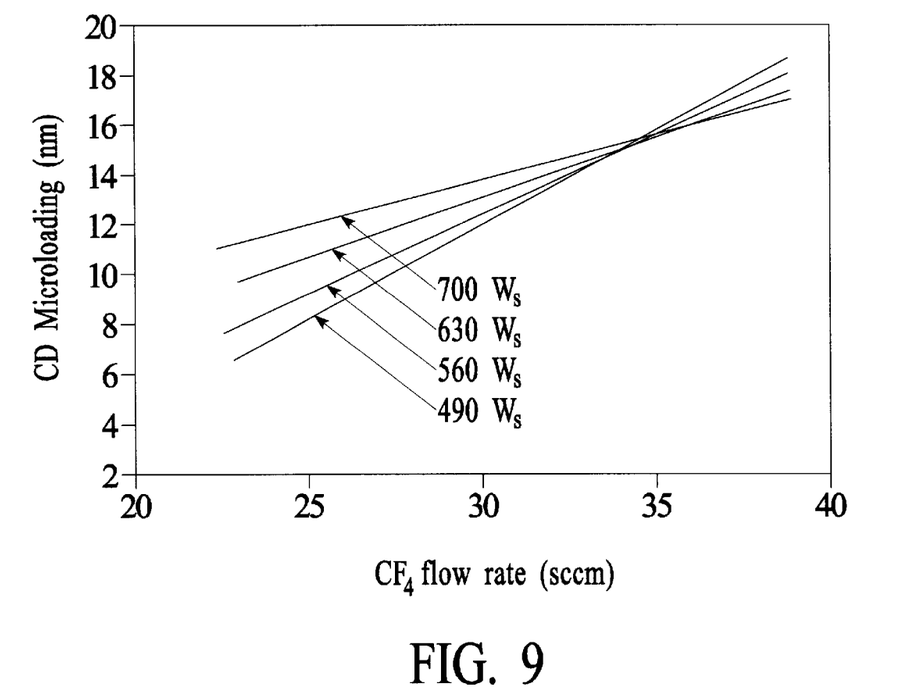
FIG. 9 is a plot of CD microloading for $CF_4$ additive gas flow rate and different source power levels.

FIG. 9 is a plot of CD microloading as a function of $CF_4$ flow rate and as a function of increasing source power levels. In these examples, etching process conditions were set at a pressure of 4 mTorr; a flow ratio of HBr/$Cl_2$ of 3; and RF bias power at 70 W. The source power level was varied from 490 to 700 Watts. For lower flow rates of $CF_4$, it is seen that CD microloading is increasingly related to the source power. For higher $CF_4$ flow rates the opposite is true. Overall, the CD microloading results are superior for a process where $CF_4$ is added to the process gas. Sixteen of the eighteen runs met the CD microloading requirement of being less than 10 nm. Reduced CD bias reduces CD microloading for both the traditional and the $CF_4$ added chemistries. The reduction, however, is significantly weaker for the $CF_4$ added chemistries.

The present etching process provides significantly improved etching properties, low CD microloading effects, and reduced CD bias for etching of features in substrates comprising silicon-material. These combined effects are difficult to obtain especially for the etching of silicon-containing material on a substrate.

Although this invention has been described in considerable detail with regard to the preferred version thereof, other versions are possible. For example, the plasma can be formed using a microwave source. Therefore, the appended claims should not be limited to the description of the preferred versions contained therein.

What is claimed is:

1. A method of etching silicon-containing material on a substrate, the method comprising the steps of:
   (a) placing the substrate having silicon containing material in a chamber; and
   (b) forming a plasma from a process gas introduced into the chamber, the process gas comprising an etchant gas comprising halogen species absent fluorine and an additive gas comprising (i) one or more of $NF_3$, $SF_6$, $Cl_2F$, $ClF_2$, and $SOF_2$, and (ii) one or more of $CH_4$, $C_2H_6$, $C_2H_4$, and $C_2H_2$, wherein the volumetric flow ratio of the additive gas to the etchant gas is from about 1:4 to about 1:20.

2. A method according to claim 1 wherein the volumetric flow ratio of the etchant gas to additive gas is selected to etch features in the silicon-containing material on the substrate while passivating the etched features with carbon based passivating material.

3. A method according to claim 1 wherein the volumetric flow ratio of the etchant gas to additive gas is selected to reduce critical dimension microloading of the etched features to less than about 10 nm.

4. A method according to claim 1 wherein the volumetric flow ratio of the etchant gas to additive gas is selected to provide a critical dimension bias of less than about 10 nm.

5. A method according to claim 1 wherein the etchant gas comprises one or more of (i) halogen species absent fluorine comprising one or more of HBr, HCl, $Cl_2$ and HI, (ii) $O_2$, and (iii) He—$O_2$.

6. A method according to claim 5 wherein the etchant gas comprises halogen species absent fluorine comprising HBr or HCl.

7. A method according to claim 1 wherein the process gas comprises etchant gas comprising one or more of HBr and $Cl_2$, and further comprises $CF_4$.

8. A method according to claim 1 wherein the substrate comprises polysilicon, metal silicide, silicon nitride, monocrystalline silicon, or silicon dioxide.

9. A method of etching silicon-containing material on a substrate, the method comprising the steps of:
   (a) placing the substrate having silicon containing material in a chamber; and
   (b) forming a plasma from a process gas introduced into the chamber, the process gas comprising an etchant gas comprising halogen species absent fluorine and an additive gas comprising (i) one or more of $NF_3$, $SF_6$, $Cl_2F$, $ClF_2$, and $SOF_2$, (ii) one or more of $CH_4$, $C_2H_6$, $C_2H_4$, and $C_2H_2$, and (iii) $CF_4$.

10. A method according to claim 9 wherein the etchant gas comprises one or more of HBr and $Cl_2$.

11. A method according to claim 1 wherein the additive gas comprises (i) one or more of $NF_3$, $Cl_2F$, $ClF_2$, and $SOF_2$, and (ii) one or more of $CH_4$, $C_2H_6$, $C_2H_4$, and $C_2H_2$.

12. A method according to claim 1 wherein the additive gas comprises (i) one or more of $NF_3$, $SF_6$, $Cl_2F$, $ClF_2$, and $SOF_2$, and (ii) one or more of $C_2H_6$, $C_2H_4$, and $C_2H_2$.

13. A method according to claim 1 wherein the etchant gas further comprises one or more of $O_2$ and He—$O_2$.

* * * * *